US010996286B2

(12) United States Patent
Schmier, II et al.

(10) Patent No.: US 10,996,286 B2
(45) Date of Patent: May 4, 2021

(54) TEST SYSTEM AND METHOD FOR A WIRING HARNESS

(71) Applicant: The Boeing Company, Chicago, IL (US)

(72) Inventors: Mark A. Schmier, II, Mesa, AZ (US); Frederick C. Edman, Mesa, AZ (US)

(73) Assignee: The Boeing Company, Chicago, IL (US)

( * ) Notice: Subject to any disclaimer, the term of this patent is extended or adjusted under 35 U.S.C. 154(b) by 106 days.

(21) Appl. No.: 16/204,917

(22) Filed: Nov. 29, 2018

(65) Prior Publication Data

US 2020/0174058 A1 Jun. 4, 2020

(51) Int. Cl.
*G01R 31/69* (2020.01)
*H01R 13/66* (2006.01)

(52) U.S. Cl.
CPC ......... *G01R 31/69* (2020.01); *H01R 13/6683* (2013.01)

(58) Field of Classification Search
CPC ........ G01R 31/50–60; G01R 31/66–71; H01R 13/6683
See application file for complete search history.

(56) References Cited

U.S. PATENT DOCUMENTS

| | | | | |
|---|---|---|---|---|
| 6,255,828 B1* | 7/2001 | Rockwell | ............... | G01R 31/69 |
| | | | | 324/539 |
| 9,664,722 B2* | 5/2017 | Hotz Ordono | ......... | G01R 31/58 |
| 2006/0043976 A1* | 3/2006 | Gervais | .................. | G01R 31/58 |
| | | | | 324/508 |
| 2009/0256548 A1* | 10/2009 | Haudeville | ........... | G01F 15/007 |
| | | | | 324/66 |
| 2010/0010758 A1* | 1/2010 | Kinahan | ................ | G01R 31/50 |
| | | | | 702/58 |
| 2013/0110433 A1* | 5/2013 | Gotschall | ............... | G01R 31/58 |
| | | | | 702/64 |
| 2016/0084902 A1* | 3/2016 | Westbrook | ............. | G01R 31/58 |
| | | | | 702/122 |
| 2018/0372785 A1* | 12/2018 | Shallo | .................... | G01R 31/58 |

* cited by examiner

*Primary Examiner* — Patrick Assouad
*Assistant Examiner* — Demetrius R Pretlow
(74) *Attorney, Agent, or Firm* — Duft & Bornsen, PC

(57) ABSTRACT

Test system and methods for testing a wiring harness. In one embodiment, a remote tester of the test system includes a connector member comprising a terminal end having one or more terminals configured to mate with terminals in an electrical connector of the wiring harness, and a tester control member integrated on a back end. The tester control member includes a housing that protrudes from the back end of the connector member, test circuitry electrically coupled to the terminals of the connector member, a wireless transceiver that communicates with a central controller to receive a test program, and a battery. The test circuitry performs a test on the wiring harness based on the test program, and reports test results to the central controller.

20 Claims, 10 Drawing Sheets

TEST SYSTEM AND METHOD FOR A WIRING HARNESS

FIELD

This disclosure relates to the field of test systems, and more particularly, to test systems for wiring harnesses.

BACKGROUND

A wiring harness is an assembly of wires that are bound together, and electrical connectors that terminate the wires. Wiring harnesses are typically used to provide electrical connectivity between devices in an aircraft, a spacecraft, a vehicle, a boat, etc. Fabrication of a wiring harness may include acquiring lengths of wire, and placing the wires on a formboard, a jig board, an assembly board, etc. The formboard is marked with the pathways or routes for the wires. Based on the design of the wiring harness, groups of wires may be routed in different directions to form branches of the wiring harness. At some point, groups of wires may be bound together by a sheath (e.g., over-braiding), and the ends of the wires are connected to terminals of the electrical connectors to complete the wiring harness. During or after fabrication, the wiring harness is attached to an electrical testing device to verify and test electrical connections of the wiring harness. Some wiring harnesses may have hundreds or thousands of individual wires that provide connectivity between multiple electrical connectors. It is therefore desirable to identify effective and efficient test systems and methods for testing wiring harnesses.

SUMMARY

Embodiments described herein include a test system and associated methods for testing a wiring harness. A test system as described herein includes remote testers that individually couple with electrical connectors of the wiring harness. The remote testers run a test process as orchestrated by a central controller, which wirelessly communicates with the remote testers. Each of the remote testers is a self-contained unit configured to perform one or more tasks of the test process. A remote tester includes a connector that electrically couples with an electrical connector of a wiring harness, and a control portion that is integrated on the back side of the connector. The structural configuration of the remote testers allows the entire remote tester unit to directly couple with an electrical connector of the wiring harness. One benefit is that no additional cabling is needed to couple a remote tester to the wiring harness, as the remote tester directly couples with the wiring harness. Another benefit is that a wiring harness may be tested during fabrication or after installation in an aircraft or the like due to the size of the remote testers, the direct coupling of the remote testers with the wiring harness, and the distributed manner of the test system.

One embodiment comprises a remote tester of a wiring harness test system. The remote tester comprises a connector member comprising a terminal end having one or more terminals configured to mate with terminals in an electrical connector of a wiring harness, and a back end opposite the terminal end. The remote tester further comprises a tester control member integrated on the back end of the connector member. The tester control member includes a housing that protrudes from the back end of the connector member, test circuitry within the housing that is electrically coupled to the terminals of the connector member, a wireless transceiver within the housing that is configured to communicate with a central controller of the wiring harness test system to receive a test program, and a battery within the housing that is configured to provide power to the test circuitry and the wireless transceiver. The test circuitry is configured to perform a test on the wiring harness based on the test program, and to report test results to the central controller via the wireless transceiver.

In another embodiment, the housing includes a side wall disposed between the back end of the connector member and an end wall.

In another embodiment, the housing further includes a removable access cover at the end wall that allows access to an interior of the housing.

In another embodiment, the housing has a cylindrical shape that fully encloses the battery, the wireless transceiver, and the test circuitry.

In another embodiment, outer dimensions of the housing correspond with outer dimensions of the connector member.

In another embodiment, the tester control member further includes a charging port configured to interface with a charging connector to charge the battery.

In another embodiment, the tester control member further includes a pairing button configured to activate a pairing mode, and a pairing indicator configured to indicate that the remote tester is paired with the central controller.

In another embodiment, the tester control member further includes a connector indicator configured to display an electrical connector identifier for the electrical connector of the wiring harness.

Another embodiment comprises a wiring harness test system that comprises a a plurality of remote testers and a central controller. The remote testers are configured to couple with electrical connectors of a wiring harness, and the central controller is configured to communicate wirelessly with the remote testers. The remote testers include a connector member comprising a terminal end having one or more terminals configured to mate with terminals in one of the electrical connectors of the wiring harness, and a back end opposite the terminal end. The remote testers further include a tester control member integrated on the back end of the connector member. The tester control member includes a housing that protrudes from the back end of the connector member, test circuitry within the housing that is electrically coupled to the terminals of the connector member, a wireless transceiver within the housing that is configured to communicate with the central controller to receive a test program, and a battery within the housing that is configured to provide power to the test circuitry and the wireless transceiver. The test circuitry is configured to perform a test on the wiring harness based on the test program, and to report test results to the central controller via the wireless transceiver.

In another embodiment, the housing includes a side wall disposed between the back end of the connector member and an end wall.

In another embodiment, the housing further includes a removable access cover at the end wall that allows access to an interior of the housing.

In another embodiment, the test circuitry is configured to selectively inject a current onto one or more of the terminals of the connector member, and to selectively monitor for current on one or more of the terminals of the connector member.

In another embodiment, the wiring harness comprises a wiring harness of an aircraft.

In another embodiment, the tester control member further includes a charging port configured to interface with a charging connector to charge the battery.

In another embodiment, the wiring harness test system further comprises a charging station comprising a plurality of docking ports. The docking ports include the charging connector configured to couple with the charging port.

In another embodiment, the charging station further includes a battery level indicator at the docking ports configured to indicate a battery level of the battery in one of the remote testers.

In another embodiment, the charging station further includes a test selection indicator at the docking ports configured to indicate whether a remote tester is selected for the test process on the wiring harness.

In another embodiment, the tester control member further includes a pairing button configured to activate a pairing mode, and a pairing indicator configured to indicate that a remote tester is paired with the central controller.

In another embodiment, the tester control member further includes a connector indicator configured to display an electrical connector identifier for one of the electrical connectors of the wiring harness.

Another embodiment comprises a method of testing a wiring harness. The method comprises selecting remote testers of a wiring harness test system that mate with electrical connectors of the wiring harness, pairing the remote testers with a central controller of the wiring harness test system, coupling the remote testers to the electrical connectors of the wiring harness, and performing a test process. The test process includes transmitting a test program from the central controller to the remote testers via wireless signals, performing a test on the wiring harness based on the test program via the remote testers, reporting test results for the test process from the remote testers to the central controller via wireless signals, and verifying a condition of the wiring harness at the central controller based on the test results.

The features, functions, and advantages that have been discussed can be achieved independently in various embodiments or may be combined in yet other embodiments, further details of which can be seen with reference to the following description and drawings.

DESCRIPTION OF THE DRAWINGS

Some embodiments of the present invention are now described, by way of example only, with reference to the accompanying drawings. The same reference number represents the same element or the same type of element on all drawings.

DETAILED DESCRIPTION

The figures and the following description illustrate specific exemplary embodiments. It will be appreciated that those skilled in the art will be able to devise various arrangements that, although not explicitly described or shown herein, embody the principles described herein and are included within the contemplated scope of the claims that follow this description. Furthermore, any examples described herein are intended to aid in understanding the principles of the disclosure, and are to be construed as being without limitation. As a result, this disclosure is not limited to the specific embodiments or examples described below, but by the claims and their equivalents.

Figure 1:
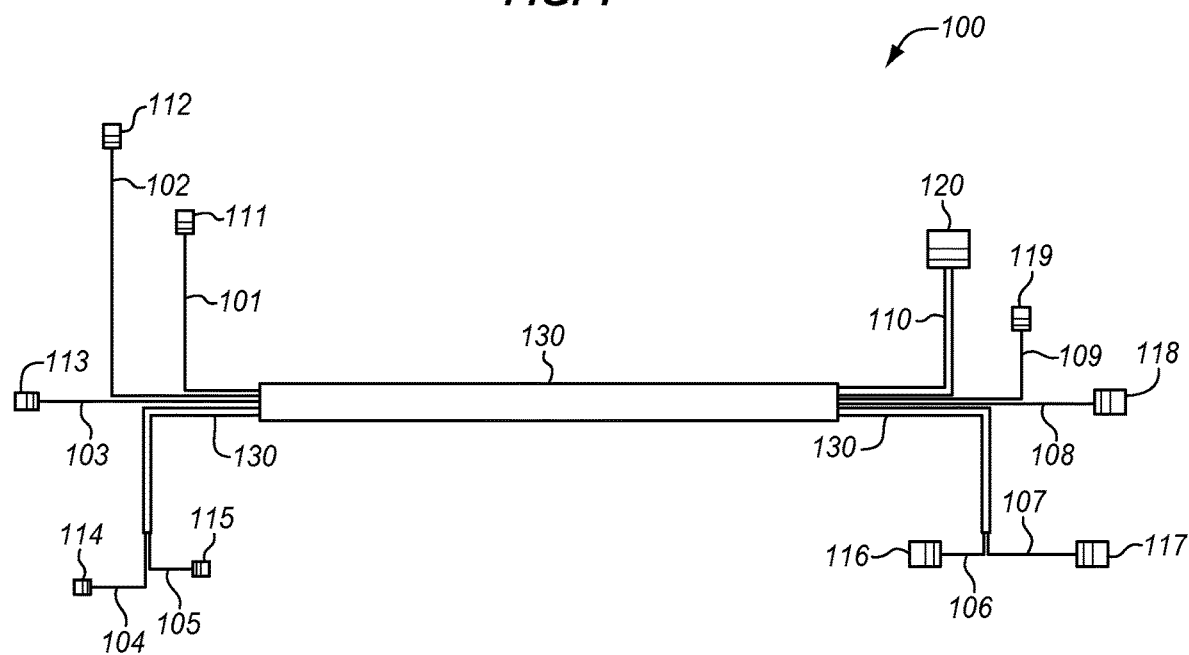
FIG. 1 illustrates a wiring harness.

FIG. 1 illustrates a wiring harness 100. Wiring harness 100 is an assembly of wires and electrical connectors, where groups of wires are bound together and the electrical connectors terminate the wires. For example, wiring harness 100 includes wire bundles 101-110, and electrical connectors 111-120 that act as termination points for wire bundles 101-110. A wire bundle 101-110 is a grouping of individual, insulated wires (not visible) that are bound by a tie, an over-braid, a sheath, a cover, a casing, etc. An electrical connector 111-120 is a device that terminates the wires of a wire bundle 101-110 with terminals (e.g., male pins or female sockets). Electrical connectors 111-120 are generally characterized by their pinout, physical construction, size, insulation between terminals, etc. Wiring harness 100 also includes one or more exterior sheaths 130 that bind one or more wire bundles 101-110. Exterior sheaths 130 may comprise a thermoplastic, an over-braid, etc. Wiring harness 100 may be fabricated for an aircraft, a spacecraft, a vehicle, a boat, or another type of machine. The configuration of wiring harness 100 as shown in FIG. 1 is just one example, and other wiring harnesses are considered herein.

Figure 2:
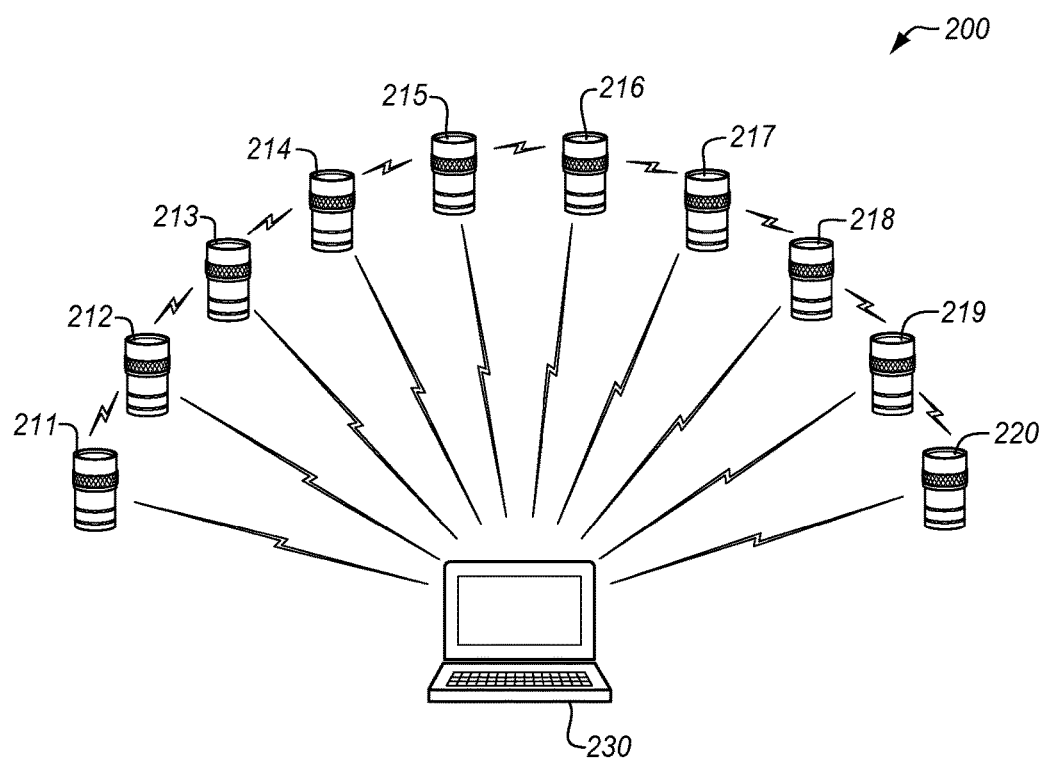
FIG. 2 is a wire harness test system in an illustrative embodiment.

FIG. 2 is a wiring harness test system 200 in an illustrative embodiment. Wiring harness test system 200 is a system configured to perform tests on a wiring harness, such as continuity tests, high-potential tests, pin-setting tests, and/or other types of tests. In this embodiment, wiring harness test system 200 comprises a plurality of remote testers 211-220, and a central controller 230. At a high level, the tasks of testing are distributed to remote testers 211-220. Remote testers 211-220 are discrete components configured to connect with electrical connectors of a wiring harness. Remote testers 211-220 are configured to wirelessly communicate with central controller 230, and possibly with each other. Remote testers 211-220 may each communicate with central controller 230 on different frequencies or channels, or may be individually addressable on a common frequency or channel. Central controller 230 is a device that manages remote testers 211-220 to perform a test process. Central controller 230 transmits one or more test programs (e.g., set of commands or instructions) to remote testers 211-220 via wireless signals. The remote testers 211-220 execute tasks based on the test program to test the wiring harness, and report test results back to central controller 230. Central controller 230 may comprise a desktop computer, a laptop, a mobile phone running an application, or another type of processing device.

One technical benefit of wiring harness test system 200 is that small, lightweight remote testers 211-220 may be coupled with the electrical connectors of the wiring harness to perform the tests, instead of relying on a heavy and cumbersome back-wired assembly on a formboard or the like. Also, because wiring harness test system 200 is highly portable, a wiring harness may be tested in situ, such as when the wiring harness is installed in an aircraft or the like.

Figure 3:
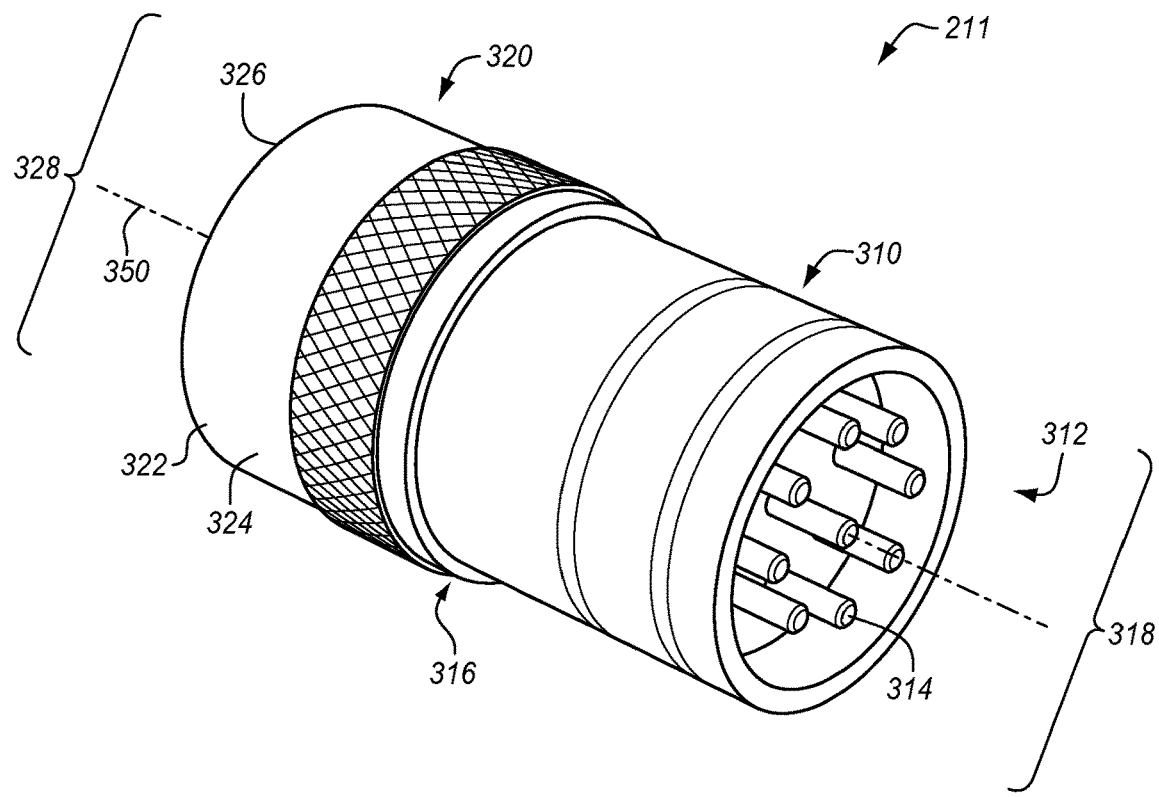
FIGS. 3-4 are perspective views of a remote tester in an illustrative embodiment.
Figure 4:
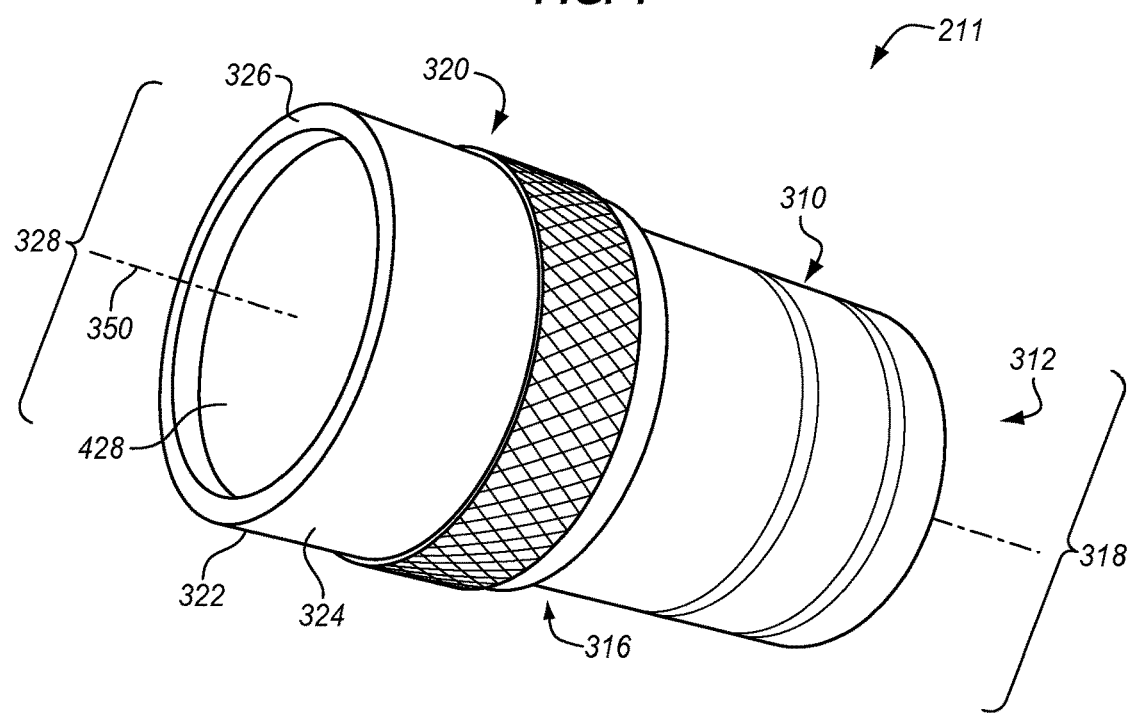

FIGS. 3-4 are perspective views of remote tester 211 in an illustrative embodiment. Remote tester 211 may have a unibody structure, or may be comprised of multiple pieces attached or affixed to form an integral object. In this embodiment, remote tester 211 includes a connector member 310 and a tester control member 320. Connector member 310 is the portion of remote tester 211 that couples to an electrical connector of a wiring harness. Thus, connector member 310 has a terminal end 312 that is configured to mate with an electrical connector of a wiring harness. In other words, the physical design of terminal end 312 is configured such that terminal end 312 is able to mate with or plug into an electrical connector of a wiring harness. For this design, terminal end 312 includes one or more terminals 314 (i.e., an electrical terminal) configured to mate with corresponding terminals in an electrical connector of a wiring harness. Terminal end 312 may comprise a plug as illustrated in FIG. 3 having male pins as terminals 314. In other embodiments, terminal end 312 may comprise a receptacle having female sockets as terminals 314. Although terminal end 312 is illustrated as a cylindrical body, terminal end 312 may have other shapes to mate with an electrical connector. Other remote testers 212-220 in FIG. 2 may have a similar design as remote tester 211, although the physical structure of the connector member 310 may vary between remote testers 211-220 to accommodate different types of electrical connectors on a wiring harness.

Opposite the terminal end 312 of connector member 310 is back end 316 (also referred to as the backshell end). Tester control member 320 is integrated on back end 316 of connector member 310, which means that tester control member 320 is directly attached, affixed, or formed into back end 316 of connector member 310. Tester control member 320 includes a housing 322 that projects or protrudes from back end 316 of connector member 310 axially in a direction opposite terminal end 312 along a longitudinal axis 350 of remote tester 211. Housing 322 is an enclosure that includes one or more side walls 324 disposed between back end 316 of connector member 310 and an end wall 326. Housing 322 may partially or fully enclose the electronics of tester control member 320 (e.g., a battery, a wireless transceiver, and test circuitry), which is described in more detail in FIG. 5. As shown in FIG. 4, end wall 326 may include a removable access cover 428 that allows access to the interior of housing 322, and the components within the interior of housing 322. Housing 322 may have a cylindrical shape as shown in FIGS. 3-4, or may have other shapes. Also, the size of housing 322 (i.e., the outer dimensions 328) may correspond with the size of connector member 310 (i.e., the outer dimensions 318) by being substantially similar, which more easily allows remote tester 211 to test a wiring harness in situ. The physical structure of remote tester 211 shown in FIGS. 3-4 is just one example, and the physical structure may vary as desired.

Figure 5:
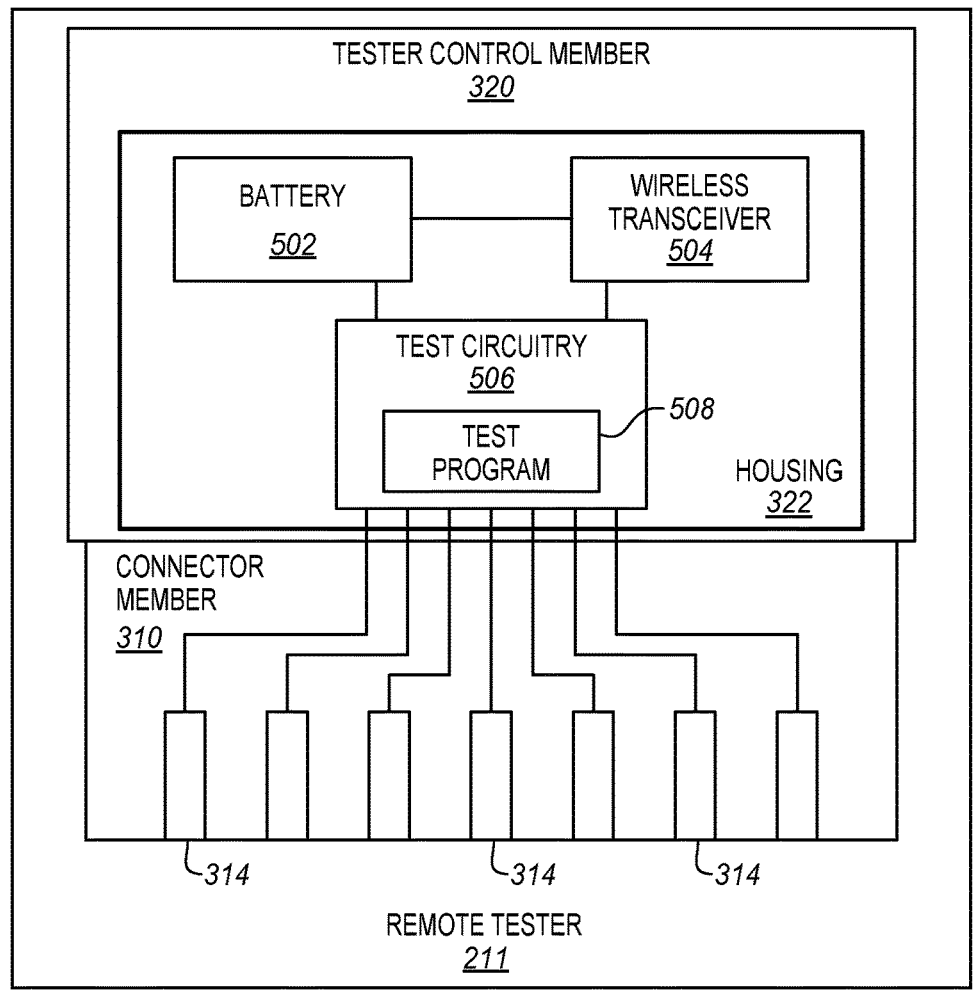
FIG. 5 is a schematic diagram of a remote tester and a central controller in an illustrative embodiment.
Figure 5:
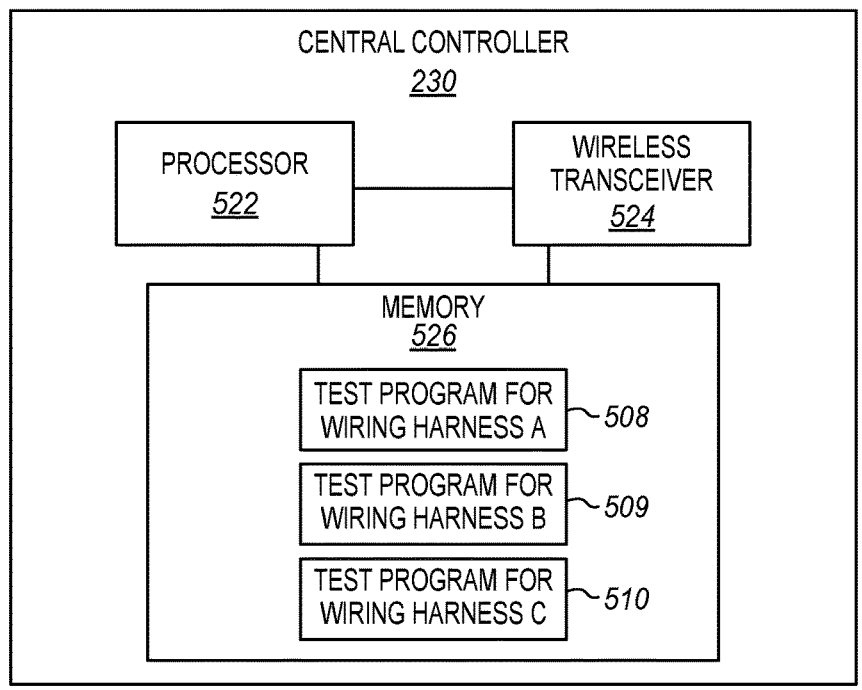

FIG. 5 is a schematic diagram of remote tester 211 and central controller 230 in an illustrative embodiment. As shown in FIGS. 3-4, remote tester 211 includes connector member 310 and tester control member 320. Tester control member 320 includes a battery 502, a wireless transceiver 504, and test circuitry 506 that are contained within housing 322. Battery 502 is configured to provide power to remote tester 211 (i.e., wireless transceiver 504 and test circuitry 506). Battery 502 may be replaceable or rechargeable, and may comprise a Nickel Cadmium, a Lithium Ion, or another type of battery. Wireless transceiver 504 comprises circuitry, hardware, antennas, and/or means configured to communicate with other devices (e.g., central controller 230) via wireless or Radio Frequency (RF) signals. Wireless transceiver 504 may use a variety of protocols for communication, such as Bluetooth (over IEEE 802.15.1), ZigBee (over IEEE 802.15.4), Wi-Fi (over IEEE 802.11), or another protocol. Test circuitry 506 comprises circuitry, hardware, logic, or means that is electrically coupled to terminals 314 of connector member 310. Thus, test circuitry 506 is electrically connected to the terminals of an electrical connector when connector member 310 is plugged into the electrical connector. Test circuitry 506 is programmable and re-programmable with a test program 508 via central controller 230. A test program 508 comprises a set of commands or instructions specifying actions to perform for a test. Based on test program 508, test circuitry 506 may selectively inject a current to one or more terminals 314, and/or may selectively monitor or sense for current on one or more terminals 314. Test circuitry 506 may also report test results to central controller 230, and possibly to other remote testers 212-220. Remote tester 211 may include additional elements not specifically described herein.

Central controller 230 includes a processor 522, a wireless transceiver 524, and a memory 526. Processor 522 comprises circuitry or hardware that controls or manages testing of a wiring harness. Wireless transceiver 524 comprises circuitry, hardware, antennas, and/or means configured to communicate with remote testers 211-220 via wireless or RF signals. Memory 526 is a computer readable storage medium for data, instructions, applications, etc., and is accessible by processor 522. Central controller 230 manages the testing of a wiring harness (e.g., wiring harness 100) by programming remote testers 211-220, and receiving test results from remote testers 211-220. Thus, memory 526 may store test programs for testing different wiring harnesses. For example, memory 526 may store test program 508 for testing wiring harness A, and may also store test program 509 for testing wiring harness B, test program 510 for testing wiring harness C, etc. Test programs 508-510 may be provisioned for continuity testing, high-potential testing, pin-setting testing, or other types of testing. A continuity test verifies electrical connections between terminals of one electrical connector and terminals of other electrical connectors for a wiring harness. A high-potential test verifies isolation between wires, terminals, etc., of the wiring harness. A pin-setting test verifies that a terminal on one electrical connector is electrically connected to the correct terminal on another electrical connector for the wiring harness. Central controller 230 may include additional elements not specifically described herein.

Figure 6:
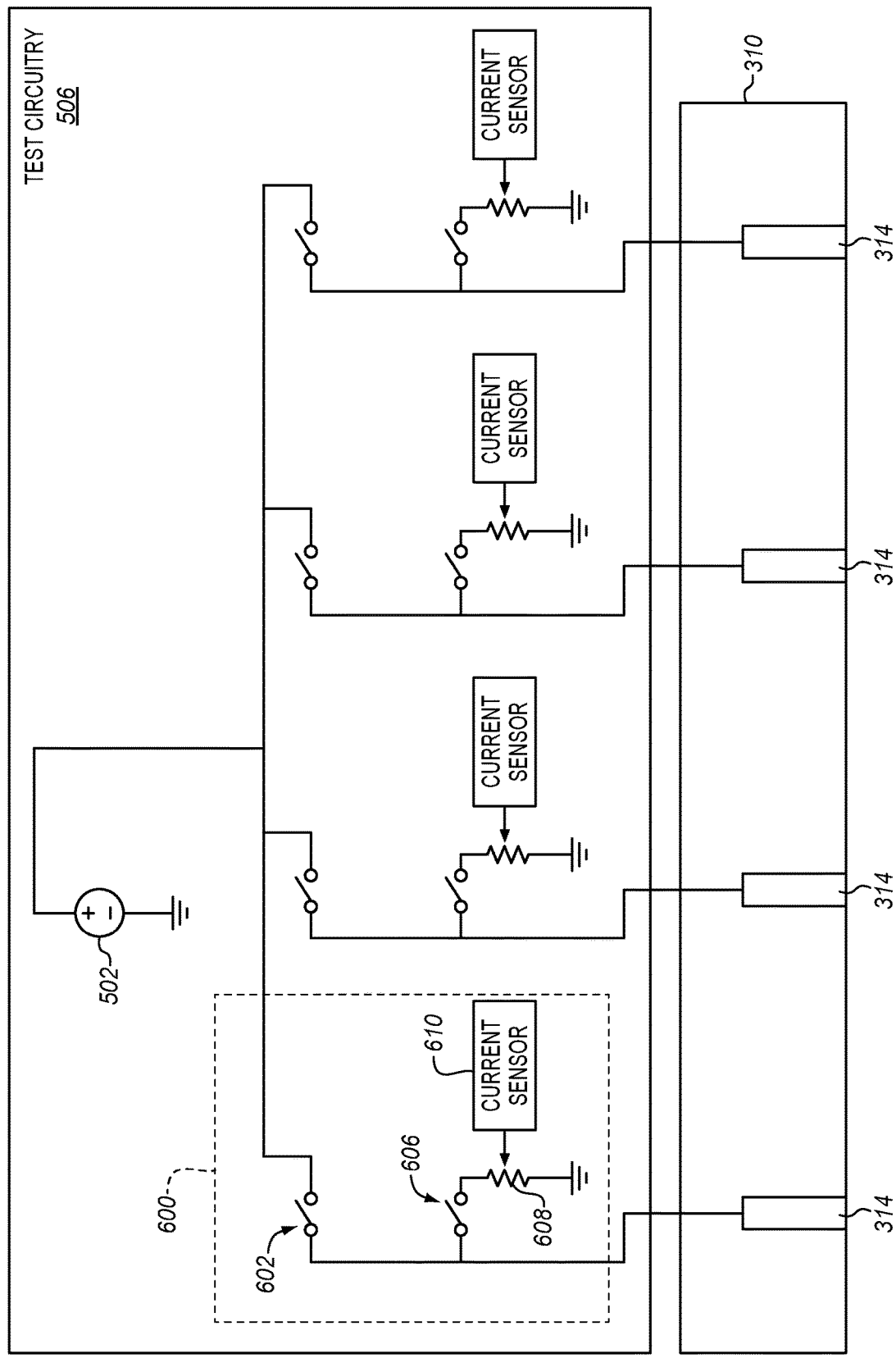
FIG. 6 is a schematic diagram of test circuitry in a remote tester in an illustrative embodiment.

FIG. 6 is a schematic diagram of test circuitry 506 in an illustrative embodiment. In this embodiment, test circuitry 506 is electrically coupled to four terminals 314 of connector member 310. Test circuitry 506 may include a terminal circuit 600 for each terminal 314. In this embodiment, terminal circuit 600 includes a switch 602 connected between battery 502 and terminal 314. Switch 602 represents a type of switching element configured to be selectively opened and closed by test circuitry 506 to inject a current onto terminal 314 based on test program 508, such as a transistor. Terminal circuit 600 also includes a switch 606 and a load 608 (indicated by a resistor) connected between terminal 314 and ground, and a current sensor 610 configured to monitor or sense a current passing through load 608. Switch 606 represents a type of switching element configured to be selectively opened and closed by test circuitry 506 to allow a current to pass through load 608. Current sensor 610 represents a type of sensing element that is configured to sense a current passing through load 608 (and also passing through terminal 314) based on test program 508. With this design, test circuitry 506 is configured to selectively inject a current onto a terminal 314, and to sense a current on the terminal 314 as part of the test program.

Figure 7:
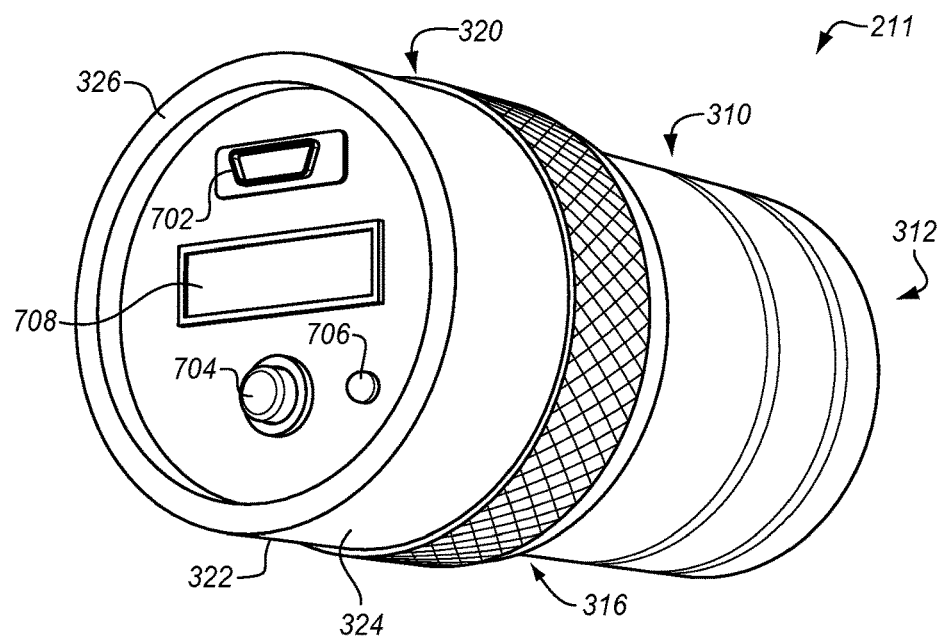
FIG. 7 is another perspective view of a remote tester in an illustrative embodiment.
Figure 8:
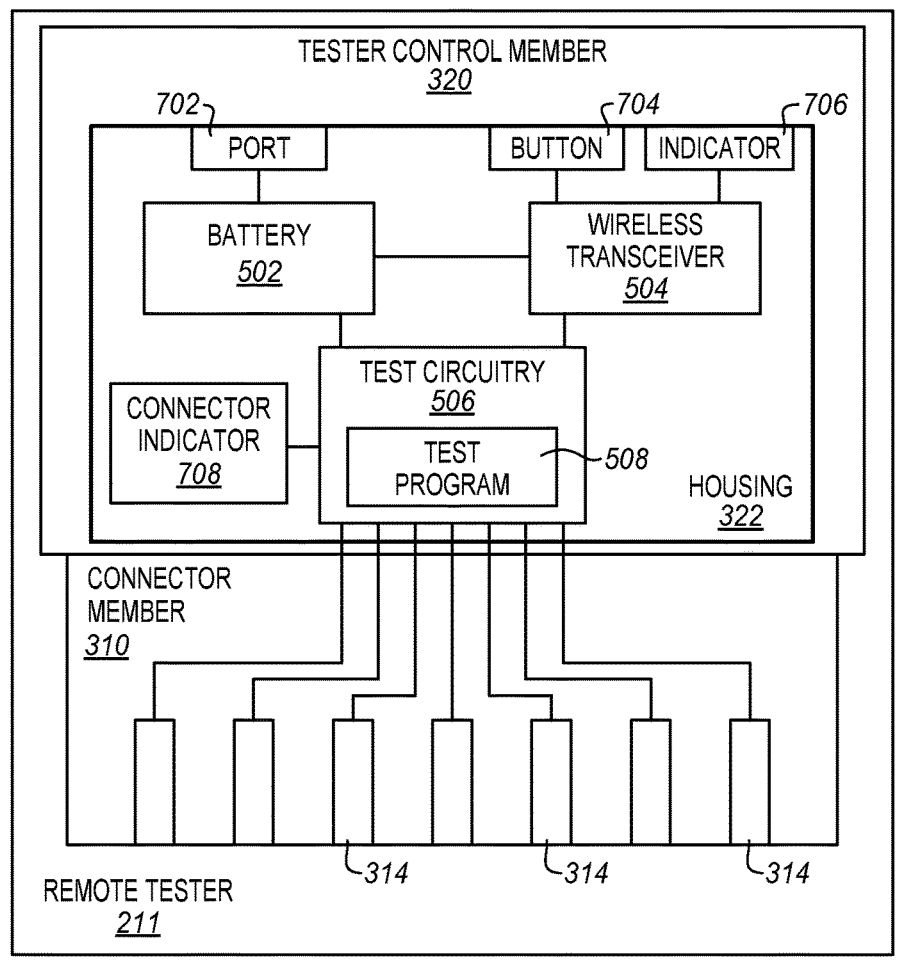
FIG. 8 is another schematic diagram of a remote tester in an illustrative embodiment.

FIGS. 7-8 show additional elements that may be added to remote tester 211 (and the other remote testers 212-220). FIG. 7 is another perspective view of remote tester 211 in an illustrative embodiment. In this figure, tester control member 320 of remote tester 211 may further include a charging port 702 that is electrically coupled with battery 502 (see FIG. 5) to allow for recharging of battery 502. Charging port 702 is configured to interface with a charging connector on a charging cable, charging station, etc., to charge battery 502. Charging port 702 may comprise a USB, a mini-USB, a micro-USB, or another connector type. Charging port 702 may be disposed on end wall 326 or side wall 324 as desired.

Tester control member 320 of remote tester 211 may further include a pairing button 704 and/or a pairing indicator 706. Pairing button 704 is electrically coupled with wireless transceiver 504 (see FIG. 5), and is configured to activate a pairing mode for remote tester 211 (i.e., through wireless transceiver 504). Pairing indicator 706 comprises a light (e.g., LED), an audible alarm, or some other instrument. Pairing indicator 706 may be configured to indicate that remote tester 211 is in pairing mode (e.g., a flashing light), and that remote tester 211 is paired with central controller 230 (e.g., a solid light). Pairing button 704 and/or a pairing indicator 706 may be disposed on end wall 326 or side wall 324 as desired. In another embodiment, pairing of wireless transceiver 504 may be activated by central controller 230, through a charging station, etc.

Remote tester 211 may further include a connector indicator 708. Connector indicator 708 comprises lights (e.g., LEDs), a display, or some other hardware component that presents information in visual form. Connector indicator 708 is configured to display an identifier (ID), a label, or other information descriptive of an electrical connector of a wiring harness. As remote tester 211 is to be mated with a particular electrical connector of a wiring harness for a test process, connector indicator 708 is configured to display an electrical connector ID or other information specific to an electrical connector so that remote tester 211 is coupled with the proper electrical connector. For example, the electrical connector ID may comprise a number or series of numbers, one or more letters, or other symbols mapped to an electrical connector. Connector indicator 708 may be disposed on end wall 326 or side wall 324 as desired.

FIG. 8 is another schematic diagram of remote tester 211 in an illustrative embodiment. This figure schematically shows charging port 702, pairing button 704, pairing indicator (IND) 706, and connector indicator 708 for tester control member 320.

Figure 9:
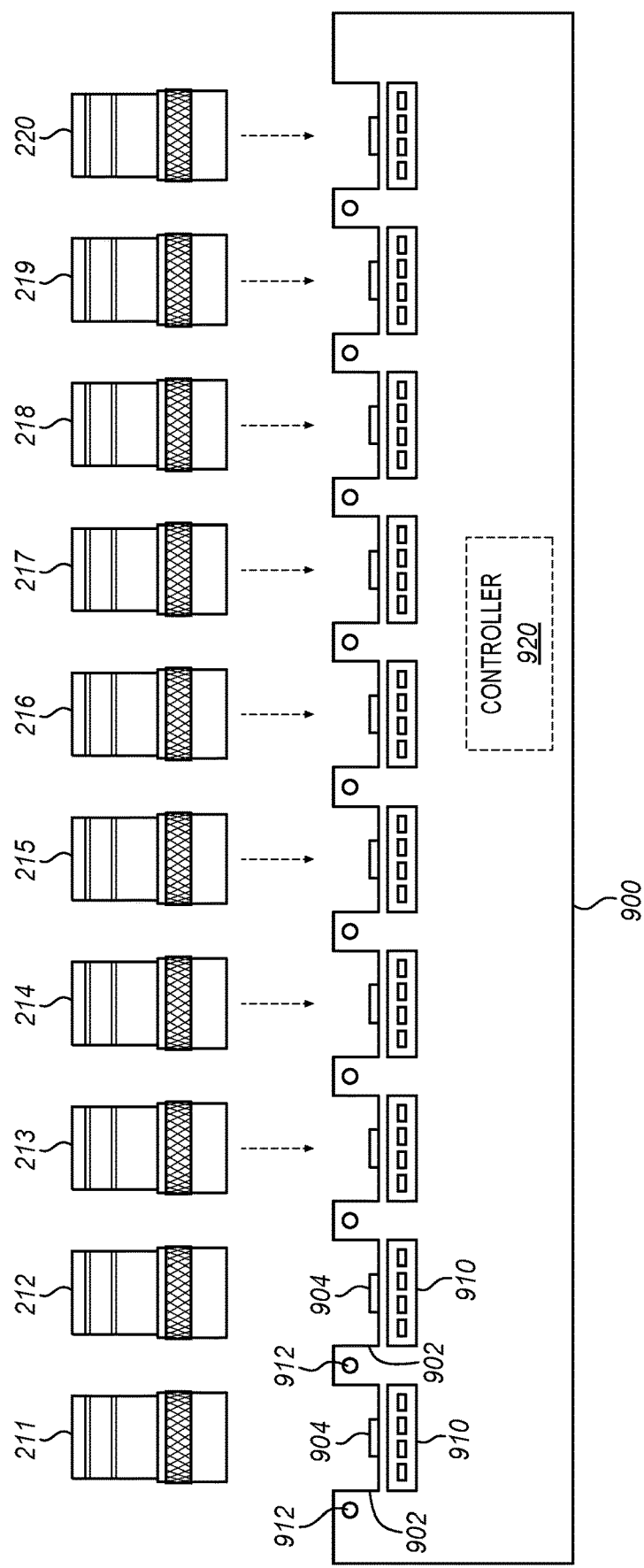
FIG. 9 illustrates a charging station in an illustrative embodiment.

Wiring harness test system 200 as described herein may further include a charging station. FIG. 9 illustrates a charging station 900 in an illustrative embodiment. Charging station 900 is configured to charge a plurality of remote testers 211-220. In this embodiment, charging station 900 includes a plurality of docking ports 902, and each of the docking ports 902 includes a charging connector 904 configured to couple with a charging port on a remote tester 211-220 (e.g., charging port 702). Therefore, when remote testers 211-220 are coupled to docking ports 902, charging station 900 operates to charge the remote testers 211-220. Charging station 900 may further include a battery level indicator 910 at each of the docking ports 902 configured to indicate the battery level of a remote tester 211-220. For example, battery level indicator 910 may comprise one or more lights or LEDs. Charging station 900 may further include a test selection indicator 912 at each of the docking ports 902 configured to indicate whether a remote tester 211-220 is selected for a test process on a particular wiring harness. For example, a controller 920 on charging station 900 may be programmed with a mapping of which remote tester 211-220 is docked at which docking port 902. As described above, some remote testers 211-220 may have different types of terminal ends 312 for mating with different types of electrical connectors, and some of remote testers 211-220 may have the same types of terminal ends 312. To avoid confusion, controller 920 may communicate with central controller 230 through wireless signals or a wired connection to receive information on the remote testers 211-220 that will be used for a test process on a particular wiring harness. Controller 920 may then activate test selection indicator 912 at the docking port 902 for those remote testers 211-220 scheduled for the test process on the wiring harness. For instance, test selection indicator 912 may comprise a light or LED that is illuminated by controller 920. An operator may therefore be able to see which of remote testers 211-220 are scheduled for a test process.

Figure 10:
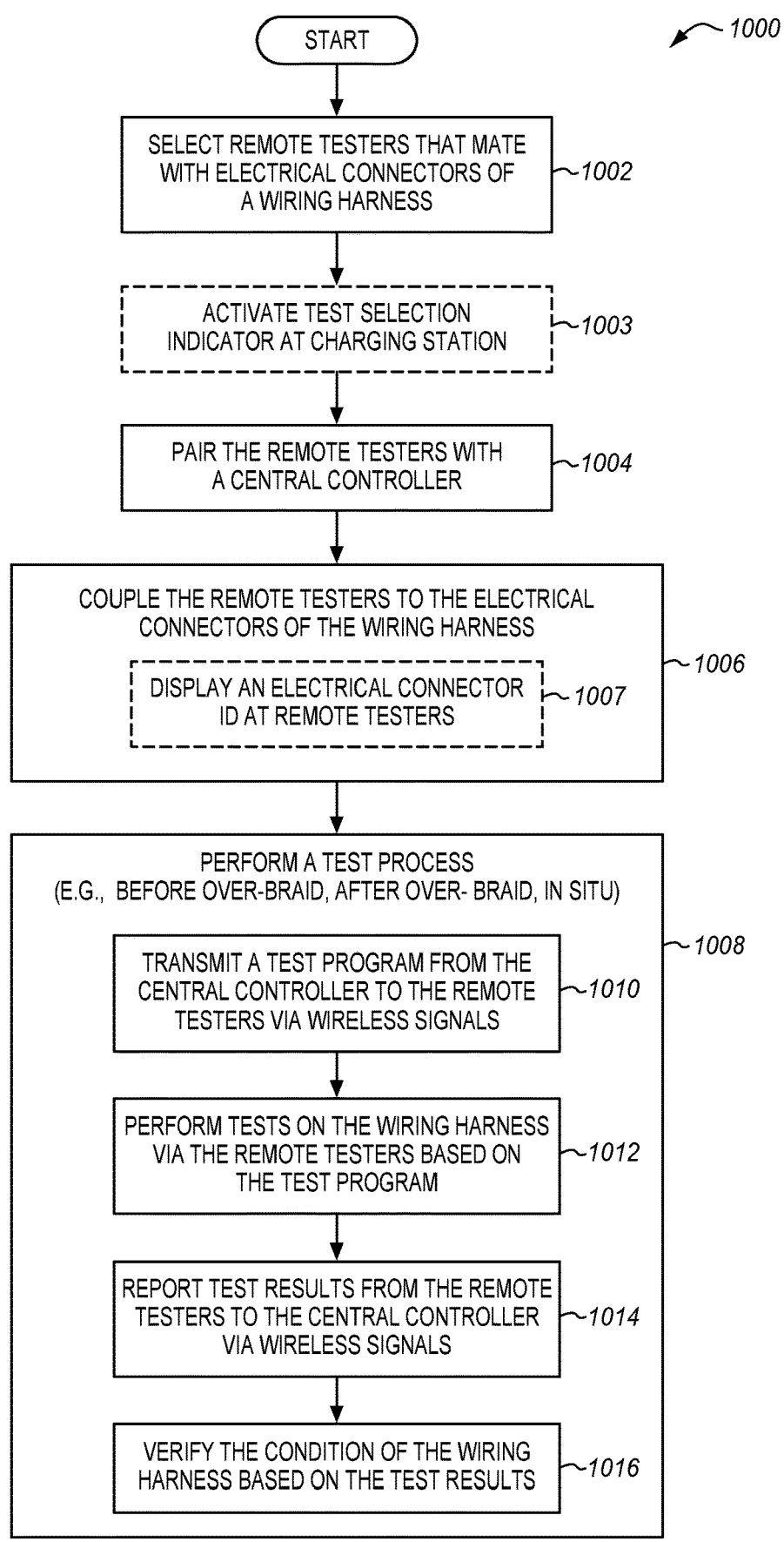
FIG. 10 is a flow chart illustrating a method of testing a wiring harness in an illustrative embodiment.

FIG. 10 is a flow chart illustrating a method 1000 of testing a wiring harness in an illustrative embodiment. The steps of method 1000 will be described with reference to wiring harness test system 200 in FIG. 2, but those skilled in the art will appreciate that method 1000 may be performed in other systems. Also, the steps of the flow charts described herein are not all inclusive and may include other steps not shown, and the steps may be performed in an alternative order.

It is assumed for method 1000 that a wiring harness (e.g., wiring harness 100) is fabricated, or is in the process of being fabricated such as on a formboard. Remote testers 211-220 of wiring harness test system 200 are selected for a test process that mate with electrical connectors 111-120 of wiring harness 100 under test (step 1002). As wiring harness 100 may have a variety of electrical connectors 111-120 of different sizes, shapes, pinouts, etc., the proper remote testers 211-220 are selected so that the connector members 310 match the electrical connectors 111-120. When remote testers 211-220 are docked at charging station 900, for example, central controller 230 may transmit information to charging station 900 indicating which of remote testers 211-220 are selected for the test process. In response to the information, controller 920 of charging station 900 may activate the test selection indicator 912 at the docking ports 902 to indicate the selected remote testers 211-220 (optional step 1003).

Remote testers 211-220, which are selected for the test process, are paired with central controller 230 (step 1004), and may also be paired with one another. Generally, pairing enables two devices to communicate with each other. For example, wireless transceivers 504 in remote testers 211-220 may enter a discovery mode to be discoverable by central controller 230, such as by pressing pairing button 704. Wireless transceiver 524 in central controller 230 detects the wireless transceivers 504 in remote testers 211-220, and establishes wireless communications between remote testers 211-220 and central controller 230. Wireless transceiver 504 in remote testers 211-220 may activate pairing indicator 706 when paired with central controller 230 so that an operator may verify that remote testers 211-220 are paired.

Figure 11:
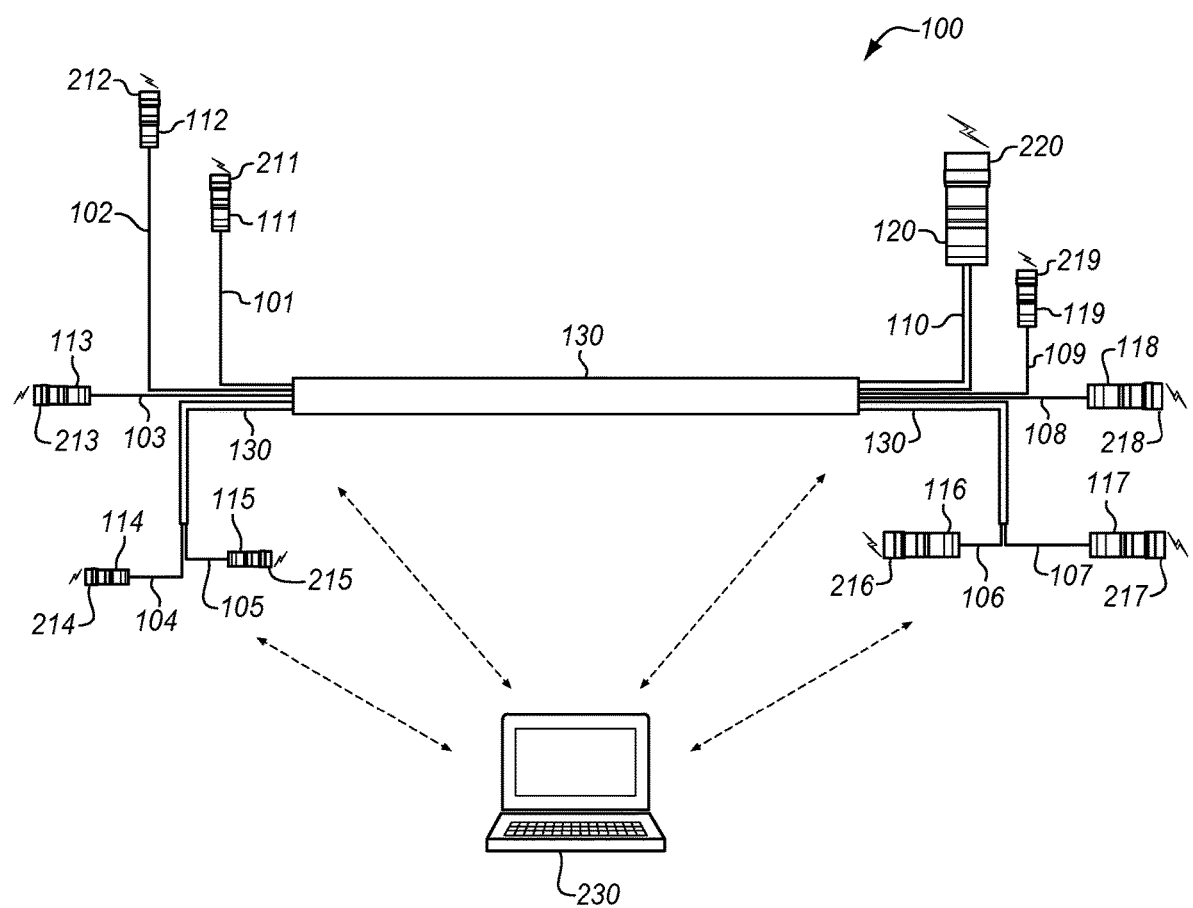
FIG. 11 illustrates remote testers coupled to electrical connectors of a wiring harness in an illustrative embodiment.

Remote testers 211-220 are coupled to the electrical connectors 111-120 of wiring harness 100 (step 1006). As part of step 1006, central controller 230 may transmit an electrical connector identifier (ID) to each of remote testers 211-220 indicating a specific electrical connector 111-120 of wiring harness 100 that is targeted for coupling with a remote tester 211-220. In response, test circuitry 506 of remote testers 211-220 displays the electrical connector ID at connector indicator 708 (optional step 1007). An operator may therefore view connector indicator 708 to determine which remote tester 211-220 couples with which electrical connector 111-120 of wiring harness 100. FIG. 11 illustrates remote testers 211-220 coupled to electrical connectors 111-120 of wiring harness 100 in an illustrative embodiment.

Remote testers 211-220 and central controller 230 then perform the test process (step 1008). In wiring harness test system 200, central controller 230 acts as the master to initiate commands to remote testers 211-220, and remote testers 211-220 act as slaves by responding to the commands from central controller 230. Therefore, central controller 230 transmits a test program 508 to remote testers 211-220 via wireless signals (step 1010). Central controller 230 may be programmed with a wiring diagram for wiring harness 100, and the test program 508 is configured to perform tests via remote testers 211-220 based on the wiring diagram. Test program 508 comprises a set of commands or instructions that direct the operation of remote testers 211-220. Central controller 230 may transmit the same test program to each of the remote testers 211-220, and the remote testers 211-220 may determine which commands to perform from the test program. Alternatively, central controller 230 may transmit a subset of the commands from test program 508 (i.e., tester-specific commands) to the remote testers 211-220 indicating the commands each remote tester 211-220 is directed to perform for the overall test program. Remote testers 211-220 receive test program 508 through wireless transceiver 504 (see FIG. 5), and store test program 508 at test circuitry 506.

Remote testers 211-220 perform one or more tests on wiring harness 100 based on the test program 508 (step 1012). For example, test circuitry 506 on remote tester 211 may execute one or more commands from test program 508 to apply a potential between a terminal A and ground (e.g., through a ground wire, ground shield, etc., of wiring harness 100) to inject a current onto terminal A. Concurrently, test circuitry 506 on remote tester 212 may execute one or more commands from test program 508 to monitor for the current on terminal B. If the current, injected at terminal A of remote tester 211, is sensed at terminal B of remote tester 212, then wiring harness 100 provides point-to-point connectivity between these two terminals. Remote testers 211-220 then report test results for the test process to central controller 230 via wireless signals (step 1014). The test results may indicate a pass/fail status, a current measurement, or other results. Central controller 230 verifies the condition of wiring harness 100 based on the test results (step 1016). For example, central controller 230 may indicate a pass or fail condition of wiring harness 100, a location of an incomplete connection (e.g., due to damage wire, improperly seated terminal, etc.), a location or worn or damaged insulation on a wire, or other information, such as to an operator via a user interface, over a network, etc.

Method 1000 or the test process (step 1008) may be performed one or more times, and at different stages of fabrication or installation of wiring harness 100. For example, the test process may be performed before over-braiding of wiring harness 100 so that damaged or broken wires, incomplete connections, etc., may be repaired before over-braiding. The test process may be performed after over-braiding to verify the condition of wiring harness 100 before installation of wiring harness 100. Further, the test process may be performed while wiring harness 100 is installed (in situ) in an aircraft or other machine. In situ testing is one particular benefit of wiring harness test system 200. Because remote testers 211-220 are compact units that directly couple with electrical connectors 111-120 of wiring harness 100, they may be used for tests after wiring harness 100 is installed in an aircraft of the like.

Figure 12:
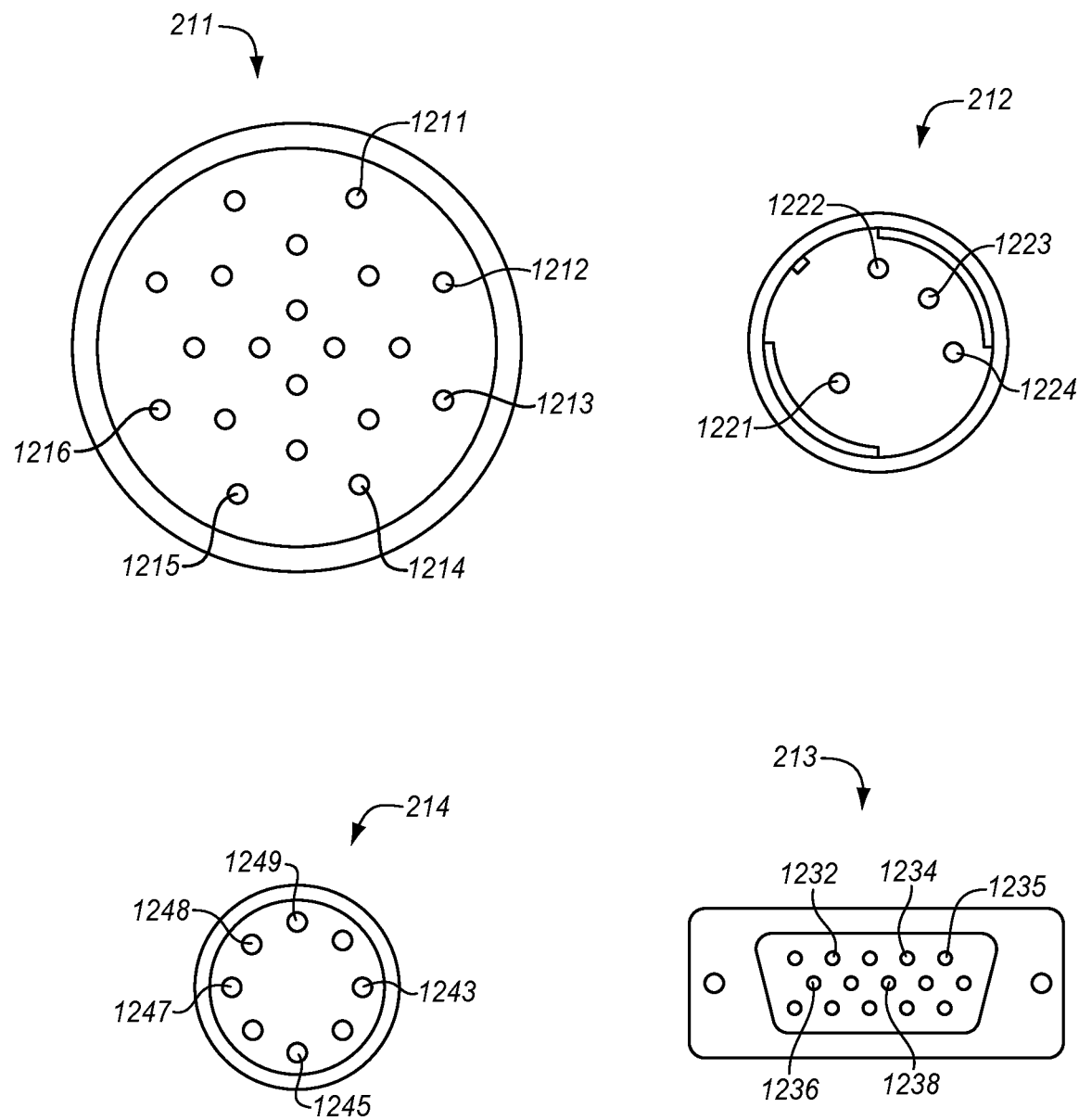
FIG. 12 illustrates the terminal ends of remote testers in an illustrative embodiment.
Figure 13:
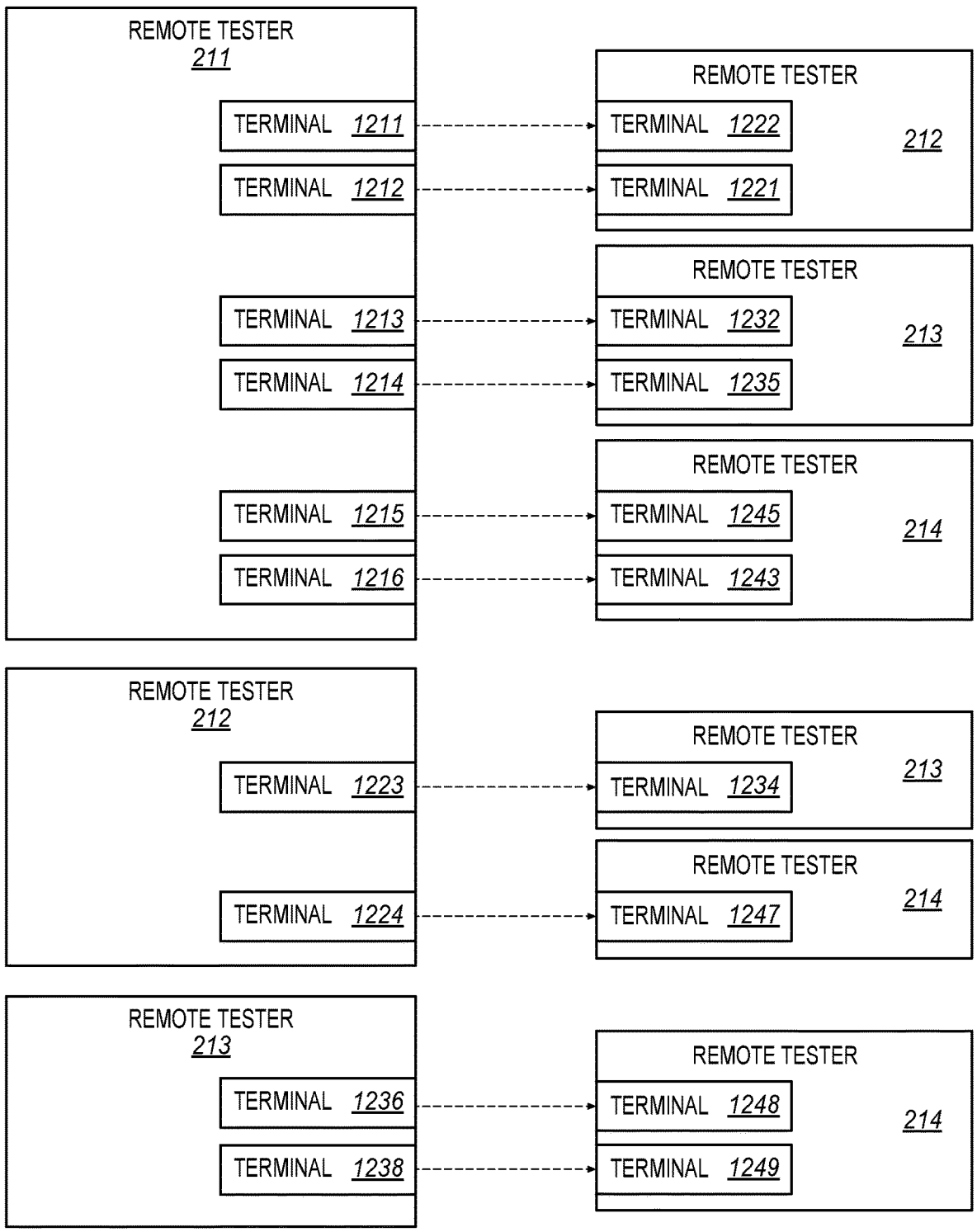
FIG. 13 is a block diagram illustrating a point-to-point continuity test in an illustrative embodiment.

The following provides an example of a test process. FIG. 12 illustrates the terminal ends 312 of remote testers 211-214 in an illustrative embodiment. Remote tester 211 includes terminals 1211-1216, remote tester 212 includes terminals 1221-1224, remote tester 213 includes terminals 1232, 1234-1236, and 1238, and remote tester 214 includes terminals 1243, 1245, and 1247-1249. It is assumed for this embodiment that remote testers 211-214 are coupled with electrical connectors 111-114 of wiring harness 100 (see FIG. 11), which have similar pin-outs. For the test process, central controller 230 downloads a test program 508 to remote testers 211-214, which execute the test program 508 to perform a continuity test. FIG. 13 is a block diagram illustrating a point-to-point continuity test in an illustrative embodiment. For the test process, remote tester 211 injects a current onto terminal 1211, and remote tester 212 monitors for the current on terminal 1222. If remote tester 212 detects the current on terminal 1222, then continuity is verified along a current path over wiring harness 100 between these terminals. Similarly, remote tester 211 injects a current onto terminal 1212, and remote tester 212 monitors for the current on terminal 1221. If remote tester 212 detects the current on terminal 1221, then continuity is verified along a current path over wiring harness 100 between these terminals. Remote testers 211-214 may perform the tests as illustrated in FIG. 13, and report test results back to central controller 230.

Any of the various elements or modules shown in the figures or described herein may be implemented as hardware, software, firmware, or some combination of these. For example, an element may be implemented as dedicated hardware. Dedicated hardware elements may be referred to as "processors", "controllers", or some similar terminology. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, a network processor, application specific integrated circuit (ASIC) or other circuitry, field programmable gate array (FPGA), read only memory (ROM) for storing software, random access memory (RAM), non-volatile storage, logic, or some other physical hardware component or module.

Also, an element may be implemented as instructions executable by a processor or a computer to perform the functions of the element. Some examples of instructions are software, program code, and firmware. The instructions are operational when executed by the processor to direct the processor to perform the functions of the element. The instructions may be stored on storage devices that are readable by the processor. Some examples of the storage devices are digital or solid-state memories, magnetic storage media such as a magnetic disks and magnetic tapes, hard drives, or optically readable digital data storage media.

As used in this application, the term "circuitry" may refer to hardware-only circuit implementations (such as implementations in only analog and/or digital circuitry), combinations of hardware circuits and software, and hardware circuit(s) and or processor(s), such as a microprocessor(s) or a portion of a microprocessor(s), that requires software (e.g., firmware) for operation, but the software may not be present when it is not needed for operation. A combination of hardware circuits and software may include a combination of analog and/or digital hardware circuit(s) with software/firmware, or any portions of hardware processor(s) with software (including digital signal processor(s)), software, and memory(ies) that work together to cause an apparatus to perform various functions).

Although specific embodiments were described herein, the scope is not limited to those specific embodiments. Rather, the scope is defined by the following claims and any equivalents thereof.

The invention claimed is:

1. A remote tester of a wiring harness test system, the remote tester comprising:
   a connector member comprising a terminal end having one or more terminals configured to mate with terminals in an electrical connector of a wiring harness, and a back end opposite the terminal end; and
   a tester control member integrated on the back end of the connector member;
   wherein the tester control member includes:
      a housing that protrudes from the back end of the connector member;
      test circuitry within the housing that is electrically coupled to the terminals of the connector member;
      a wireless transceiver within the housing that is configured to communicate with a central controller of the wiring harness test system to receive a test program;
      a pairing button configured to activate a pairing mode;
      a pairing indicator configured to indicate that the remote tester is paired with the central controller; and
      a battery within the housing that is configured to provide power to the test circuitry and the wireless transceiver;
      wherein the test circuitry is configured to perform a test on the wiring harness based on the test program, and to report test results to the central controller via the wireless transceiver.

2. The remote tester of claim 1, wherein:
   the housing includes a side wall disposed between the back end of the connector member and an end wall.

3. The remote tester of claim 2, wherein:
   the housing further includes a removable access cover at the end wall that allows access to an interior of the housing.

4. The remote tester of claim 1, wherein:
   the housing has a cylindrical shape that fully encloses the battery, the wireless transceiver, and the test circuitry.

5. The remote tester of claim 1, wherein:
   outer dimensions of the housing correspond with outer dimensions of the connector member.

6. The remote tester of claim 1, wherein the tester control member further includes:
   a charging port configured to interface with a charging connector to charge the battery.

7. The remote tester of claim 1, wherein the test circuitry includes:
   a terminal circuit for each of the terminals;
   the terminal circuit includes a first switch connected between the battery and a terminal of the terminals, wherein the first switch is configured to selectively open and close to inject a current onto the terminal;
   the terminal circuit further includes a second switch and a load connected between the terminal and ground, and a current sensor configured to sense a current passing through the load, wherein the second switch is configured to selectively open and close to allow a current to pass through the load.

8. The remote tester of claim 1, wherein the tester control member further includes:
   a connector indicator configured to display an electrical connector identifier indicating the electrical connector of the wiring harness that is targeted for coupling with the remote tester.

9. A wiring harness test system, comprising:
   a plurality of remote testers configured to couple with electrical connectors of a wiring harness; and
   a central controller;
   wherein each remote tester of the plurality includes:
      a connector member comprising a terminal end having one or more terminals configured to mate with terminals in an electrical connector of the wiring harness, and a back end opposite the terminal end; and
      a tester control member integrated on the back end of the connector member;
      wherein the tester control member includes:
         a housing that protrudes from the back end of the connector member;
         test circuitry within the housing that is electrically coupled to the terminals of the connector member;
         a wireless transceiver within the housing that is configured to communicate with the central controller to receive a test program;
         a pairing button configured to activate a pairing mode;
         a pairing indicator configured to indicate that the remote tester is paired with the central controller; and
         a battery within the housing that is configured to provide power to the test circuitry and the wireless transceiver;
         wherein the test circuitry is configured to perform a test on the wiring harness based on the test program, and to report test results to the central controller via the wireless transceiver.

10. The wiring harness test system of claim 9, wherein:
    the housing includes a side wall disposed between the back end of the connector member and an end wall.

11. The wiring harness test system of claim 10, wherein:
    the housing further includes a removable access cover at the end wall that allows access to an interior of the housing.

12. The wiring harness test system of claim 9, wherein: the housing has a cylindrical shape that fully encloses the battery, the wireless transceiver, and the test circuitry.

13. The wiring harness test system of claim 9, wherein: outer dimensions of the housing correspond with outer dimensions of the connector member.

14. The wiring harness test system of claim 9, wherein the tester control member further includes:
a charging port configured to interface with a charging connector to charge the battery.

15. The wiring harness test system of claim 9, wherein the test circuitry includes:
a terminal circuit for each of the terminals;
the terminal circuit includes a first switch connected between the battery and a terminal of the terminals, wherein the first switch is configured to selectively open and close to inject a current onto the terminal;
the terminal circuit further includes a second switch and a load connected between the terminal and ground, and a current sensor configured to sense a current passing through the load, wherein the second switch is configured to selectively open and close to allow a current to pass through the load.

16. The wiring harness test system of claim 9, wherein the tester control member further includes:
a connector indicator configured to display an electrical connector identifier indicating the electrical connector of the wiring harness that is targeted for coupling with the remote tester.

17. A method of testing a wiring harness, the method comprising:
selecting a plurality of remote testers of a wiring harness test system to mate with electrical connectors of the wiring harness, wherein each remote tester of the plurality includes:
a connector member comprising a terminal end having one or more terminals configured to mate with terminals in an electrical connector of the wiring harness, and a back end opposite the terminal end; and
a tester control member integrated on the back end of the connector member;
wherein the tester control member includes:
a housing that protrudes from the back end of the connector member;
test circuitry within the housing that is electrically coupled to the terminals of the connector member;
a wireless transceiver within the housing that is configured to communicate with a central controller of the wiring harness test system to receive a test program;
a pairing button configured to activate a pairing mode;
a pairing indicator configured to indicate that the remote tester is paired with the central controller; and
a battery within the housing that is configured to provide power to the test circuitry and the wireless transceiver;
pairing the remote testers with the central controller;
coupling the remote testers to the electrical connectors of the wiring harness; and
performing a test process by:
transmitting the test program from the central controller to the remote testers via wireless signals;
performing, at the remote testers, a test on the wiring harness based on the test program;
reporting test results for the test process from the remote testers to the central controller via wireless signals; and
verifying, at the central controller, a condition of the wiring harness based on the test results.

18. The method of claim 17 further comprising:
entering, at the wireless transceiver, a discovery mode to be discoverable by the central controller when the pairing button is pressed; and
activating the pairing indicator when paired with the central controller.

19. The method of claim 17 wherein coupling the remote testers to the electrical connectors of the wiring harness comprises:
transmitting an electrical connector identifier from the central controller to each of the remote testers indicating an electrical connector of the wiring harness that is targeted for coupling with a respective remote tester.

20. The method of claim 19 wherein coupling the remote testers to the electrical connectors of the wiring harness further comprises:
displaying the electrical connector identifier at a connector indicator in the respective remote tester.

* * * * *